United States Patent

Aird

[15] 3,689,991

[45] Sept. 12, 1972

[54] METHOD OF MANUFACTURING A SEMICONDUCTOR DEVICE UTILIZING A FLEXIBLE CARRIER

[72] Inventor: Alanson D. Aird, North Syracuse, N.Y.

[73] Assignee: General Electric Company

[22] Filed: March 6, 1970

[21] Appl. No.: 17,012

Related U.S. Application Data

[63] Continuation of Ser. No. 709,651, March 1, 1968, abandoned.

[52] U.S. Cl.....................29/577, 29/589, 174/DIG. 3

[51] Int. Cl.............................B01g 17/00, H01l 7/00

[58] Field of Search.....................29/576 S, 577, 589; 174/DIG. 3; 317/234 N

[56] References Cited

UNITED STATES PATENTS

| | | | |
|---|---|---|---|
| 3,390,308 | 6/1968 | Marley | 317/100 |
| 3,374,537 | 3/1968 | Doelp | 29/627 |
| 3,317,287 | 5/1967 | Caracciolo | 29/196 |

*Primary Examiner*—John F. Campbell
*Assistant Examiner*—W. Tupman
*Attorney*—Robert J. Mooney, Nathan J. Cornfeld, Oscar B. Waddell, Frank L. Neuhauser and Joseph B. Forman

[57] ABSTRACT

Semiconductor devices such as transistors are manufactured by use of a longitudinally extending tape-like carrier including a metallic layer secured to a flexible insulative layer, with the insulative layer having centrally located longitudinally spaced apertures. These apertures are covered by the metallic layer and are dimensioned to encompass contact regions of a semiconductor body such as a transistor or monolithic integrated circuit pellet. Longitudinally spaced sets of finger-like leads are formed from the metallic layer with the inner portions of the leads of each set extending cantilever-wise within the periphery of a respective adjacent aperture for registry with the contact portions of a semiconductor pellet. The leads of each set are connected to the contacts of a pellet registered with the adjacent aperture, the respective pellets and portions of the leads connected thereto are encapsulated, and the carrier may be reeled or otherwise automatically handled, with individual devices obtainable by severance from the carrier.

8 Claims, 14 Drawing Figures

INVENTOR:
ALANSON D. AIRD,
BY Robert J. Mooney
HIS ATTORNEY.

INVENTOR:
ALANSON D. AIRD,
BY Robert J. Mooney
HIS ATTORNEY.

INVENTOR:
ALANSON D. AIRD,
BY Robert J. Mooney
HIS ATTORNEY.

A METHOD OF MANUFACTURING A SEMICONDUCTOR DEVICE UTILIZING A FLEXIBLE CARRIER

This invention relates to improvements in semiconductor devices and methods of manufacture thereof and is a continuation of my earlier copending application, Ser. No. 709,651, filed Mar. 1, 1968, now abandoned.

BACKGROUND OF THE INVENTION

Despite the rapid advances that have been made in the technology of basic semiconductor research, the manufacturing processes for producing semiconductor devices have not taken concomitant strides to enable a high speed, efficient and inexpensive production of semiconductor products. By way of example, in one known process for manufacturing a semiconductor device, electrically active elements, commonly referred to as semiconductor pellets, each of which consists of a plurality of electrically active regions (which may include for example a collector region, base region, and emitter region in one pellet) are applied to a metallic supporting substrate at regularly spaced intervals by bonding one region of the semiconductor pellet to the substrate. Connecting wire leads are then individually permanently bonded to the remaining active regions. Each pellet and the portion of the carrier to which it is secured is then affixed to an external lead sub-assembly to which the carrier and the wire leads are suitably joined to provide external connections. The resulting assembly is then encapsulated to form the finished semiconductor product.

While the above-described technique for manufacturing semiconductor devices, and others used in the art have been found to be efficacious for semiconductor devices comprised of a small number of terminals, such as diodes and transistors, the method becomes somewhat time consuming because each lead to be connected to an active region of the pellet and the external terminal conductor must be individually bonded. Such one-at-a-time bonding of wire leads requires considerable time and operator skill. Furthermore, when the semiconductor pellet is an integrated circuit containing a large number of wire leads to be bonded to the active regions of the semiconductor pellet, the problems and disadvantages of prior art semiconductor manufacturing methods become compounded. Face-down bonding of pellets to simultaneously interconnect a plurality of pellet regions to predetermined areas on a ceramic or other insulative substrate has also been employed, but such bonds are hidden from view and use up a relatively large area of the pellet per contact, so that for a large number of contacts or small contact areas they are not entirely satisfactory.

One object of the present invention is to provide improved semiconductor devices and a method of manufacture thereof wherein external leads are secured to the metallic contact regions of the semiconductor body of the semiconductor device with a minimum of application of direct labor, and attendant minimumization of manufacturing cost.

Another object is to provide an improved semiconductor device manufacturing process which is particularly suitable for high volume, high speed assembly, handling, and testing of such devices with a minimum of manual transfer or other manual handling operations.

Another object is to provide an improved product and process of the foregoing character wherein a plurality of leads are connected simultaneously to a semiconductor body in a plurality of contact regions which occupy a minimized area of the semiconductor body.

The foregoing advantages are achieved and the above-described disadvantages are overcome as will now be described. Generally, in accordance with a preferred embodiment of the invention, semiconductor devices may be manufactured by a method comprising the steps of adhering a continuous strip or ribbon of foil-like electrically conductive metallic material to a surface of a pre-apertured tape of a flexible electrically insulating material, forming a plurality of sets or families of leads from said metallic strip with the inner portions of the leads of each set extending cantilever-wise inwardly past the periphery of an adjacent aperture in said tape, and with the inner ends of the leads of each set or family of leads so dimensioned and arranged as to be registrable with respective metallic contacts on a semiconductor pellet. Successive semiconductor bodies or pellets, in which appropriate PN junctions or other suitable regions of desired conductivity type and characteristics have previously been produced, are then positioned relative to the tape so that the metallic contacts of each pellet and the inner ends of the leads of successive sets of leads are in registry. Then simultaneously soldering or otherwise joining the registered lead ends and pellet contacts assembles the pellets to the tape with minimum labor and time. After bonding to its leads, the semiconductor pellet may to the extent desired be enclosed in a suitable encapsulant, and the resulting semiconductor device may be shaped and finished in various ways and means as will be described hereinafter.

DESCRIPTION OF THE INVENTION

Figure 1:
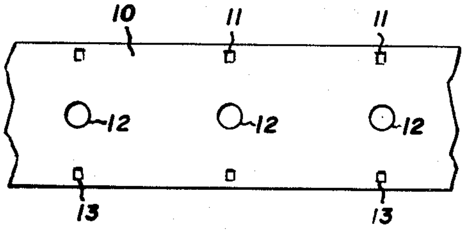
FIG. 1 depicts a segment of a tape of insulating material suitable for use in accordance with the present invention.

FIG. 1 depicts a ribbon or tape 10 of any suitable insulating material; for example, an organic resin such as the polyester known commercially as Mylar, or a polyimide such as Kapton (both available from the Du Pont Company, Wilmington, Delaware). If desired, the insulating layer 10 may be backed or clad, for reinforcing or other purposes, with an additional strengthening layer (not shown) which may be insulative, conductive, or semiconductive.

As shown in FIG. 1, the insulating tape 10 is provided with a plurality of central apertures 12, substantially equally spaced apart along the length of the tape 10. The apertures 12 are generally substantially centrally located along the width of the tape 10. As will be apparent hereinafter, the diameter of the aperture 12 preferably is of a size adapted to contain within the periphery thereof contact regions of a semiconductor pellet. The aperture 12 may, for example, be slightly larger than the surface area of the semiconductor pellet on which the metallic contacts are located.

Figure 2:
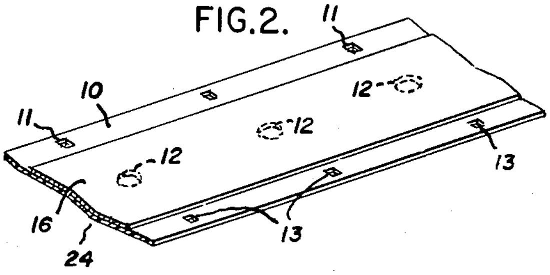
FIG. 2 shows one embodiment of a novel carrier constructed according to the present invention.

As shown in FIG. 2, a thin strip of a continuous electrically insulating tape 10 having pre-punched apertures 12 at regularly spaced apart intervals is supplied from a spool or reel (not shown) and a thin foil-like strip or layer 16 of metallic electrically conducting material is secured to tape 10, at least in the regions of tape 10 adjacent apertures 12, by any suitable means, such as adhesive lamination. The insulating tape 10, having the properties described above may have a thickness of, for example, about 0.003 to 0.005 inch, and the metallic layer 16 may have a thickness of, for example, about 0.0005 to 0.001 inch. In one embodiment, the layer 16 was a copper sheet 0.0007 inch thick.

The resulting laminate of tape 10 and metallic layer 16 is more clearly shown at 24 in FIG. 2 and provides an elongated continuous carrier or article which is useful according to the invention as hereinafter described. Also shown in FIG. 2 are a plurality of marginal indexing openings 11 and 13, extending entirely through laminate 24, for indexing and precise positioning of the tape 10. Each of the apertures 12 is of a size adapted to contain within the periphery thereof contact regions of a semiconductor pellet. The metallic layer 16 adheres to the tape 10 in at least the regions of the tape surface adjacent each of the apertures 12, and metallic layer 16 extends across and thereby covers each adjacent aperture 12.

Figure 3:
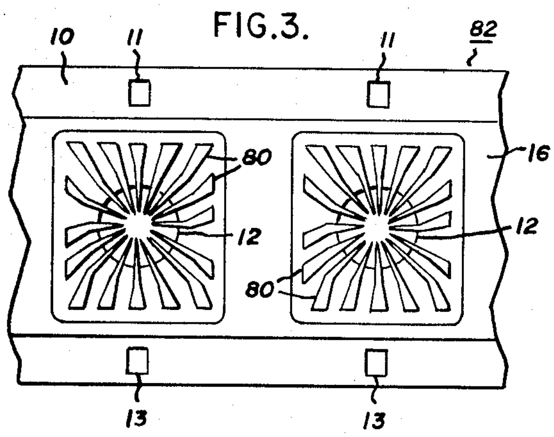
FIG. 3 shows the carrier of FIG. 2 after a subsequent stage of processing according to the invention.

By photolithographic masking and etching, or other suitable known techniques, portions of layer 16 are removed from the tape 10 as shown in FIG. 3 to form on said tape a plurality of sets of metallic leads 80, each set being adjacent an aperture 12 with the leads of each set arranged in a predetermined pattern of generally radial fingers extending cantilever-wise inwardly beyond the periphery of the aperture 12, whereby the inner portions of the leads 80 of each set may be registered with metallic contacts on a semiconductor pellet disposed opposite the aperture 12. The metallic leads 80 are, of course, thin foil-like strips similarly as the metallic layer 16 from which they are formed. If photolithographic etching techniques are used to produce leads 80, the portions of the reverse faces of the metallic sheet 16 exposed by apertures 12 should be covered by the usual photoresist, as well as the outside surface of sheet 16, to prevent the etchant from attacking the underside of fingers 80.

After formation of the sets of leads 80, the processed carrier 82 will appear as shown in FIG. 3. FIG. 3 depicts a portion of the carrier or article 82 having two apertures 12 and two sets of leads 80. The leads 80 of each set adhere to the insulating tape 10 and are arranged on the surface of the tape in a pattern of fingers extending generally radially outward from a respective aperture 12. The inner end portions of the leads of each set extend inwardly within the area encompassed by the periphery of the adjacent aperture 12 for registry with the contact regions of a semiconductor pellet that may be arranged opposite the respective aperture. The size and shape of the aperture 12 may vary with the pattern of the metallic contacts on the semiconductor pellet that is to be bonded to the metallic leads, and aperture 12 should be of such size and shape that its periphery encompasses such contacts.

Figure 4:
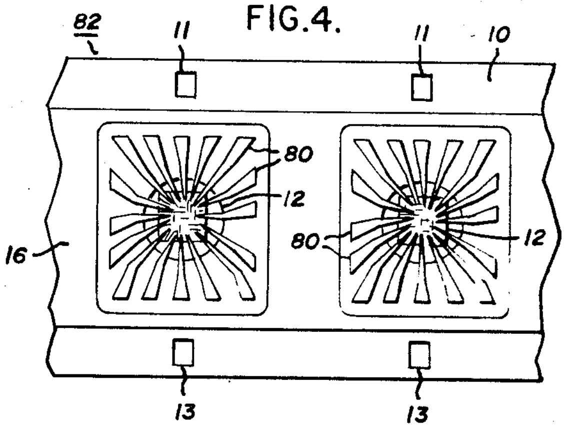
FIG. 4 is similar to FIG. 3, showing a later stage of semiconductor device manufacture according to the invention.
Figure 5:
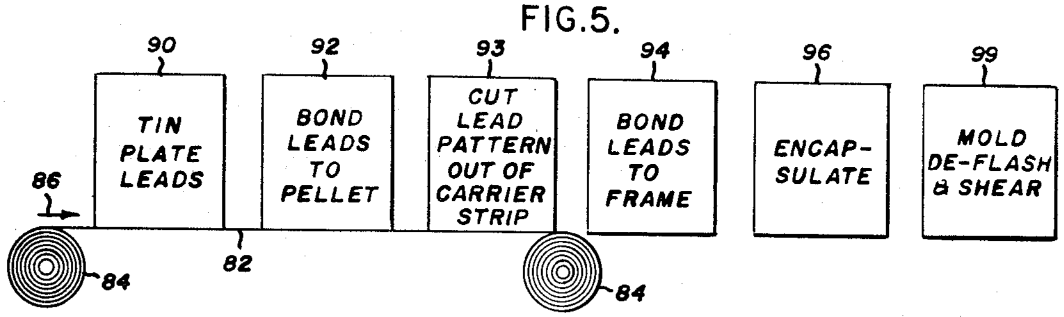
FIG. 5 is a block diagram of a process for attaching semiconductor pellets to the carrier of FIG. 3.

According to the invention, a series of semiconductor pellets are attached to the carrier 82, in registry with respective apertures 12, as shown in FIGS. 4 and 5. As shown in FIG. 5, a continuous strip of the carrier 82 is unwound from a reel 84 in the direction depicted by the arrows 86. The carrier 82, having sets of leads 80, is first immersed in a suitable plating solution to plate all the exposed portions of the lead patterns 80 with a suitable solderable metal such as tin, as depicted by 90, including the back portions of leads 80 where the reverse faces of the leads may be exposed. Relative movement is then affected between the carrier 82 and successive semiconductor pellets, so that the inner end portions of each set of leads are brought into registry with metallic contacts on a respective semiconductor pellet, and thus according to the step depicted by the numeral 92, the contacts of each pellet may be bonded to the leads of a set at the inner end portions of the leads. As shown in FIG. 5, each set of leads with its respective pellet can then be severed from the carrier 82, as shown by the step 93, and the outer end portions of the set of leads can be bonded to a stamped sheet metal lead frame as in 94. The pellet may then be encapsulated as in 96, and molding, deflashing, shearing, etc. may be performed as in 99. Also, the leads of a set may be removed from tape layer 10, by peeling, stripping, dissolution of the laminating adhesive, or in any other suitable fashion, in which case the layer 10 need not be limited to electrically insulating material but may be, for example, metal or any other suitable flexible material.

Figure 6:
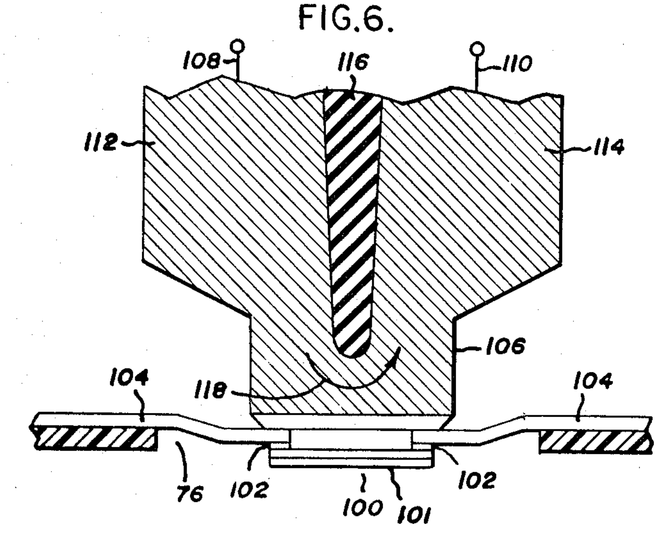
FIG. 6 is an enlarged view of apparatus utilized in a preferred system and method for securing semiconductor pellets to the carrier such as that shown in FIG. 3.

FIG. 6 depicts a particularly efficacious arrangement for bonding the lead patterns to the metallic contacts on a semiconductor pellet. As shown therein, a semiconductor pellet 100 which may be, for example, a planar bipolar transistor pellet in which the emitter, base and collector regions have already been formed, having gold-covered raised metallic contacts 102 attached to electrically active regions of the semiconductor pellet, is placed face up, adjacent to tin plated copper leads 104 with the inner terminations or end portions of the plated copper leads 104 being atop and abutting the metallic contacts 102. To effect the bonding of the contacts 102 to the tinned leads 104, the tin plated leads 104 are pressed against the gold surface portions of contacts 102 by a downward movement of the heatable bonding tip 106. Bonding is then achieved by applying a suitable electrical resistance heating current to tip 106 through the conductors 108 and 110. The conducting portions 112 and 114 of the bonding apparatus are separated by an insulating material 116, and hence with conductor 108 connected to conducting portion 112 and conductor 110 connected to conducting portion 114, current will flow in the direction depicted by the arrow 118 in FIG. 11, whereby the bonding tip 106 will be raised to a sufficiently high temperature to cause the tin plated copper leads 104 to be bonded to the gold contacts 102. It should be noted that the semiconductor pellet 100 is positioned within the area defined by the aperture 76, and toward this end, location means such as the sprocket holes 13 may be used on the carrier.

Figure 7:
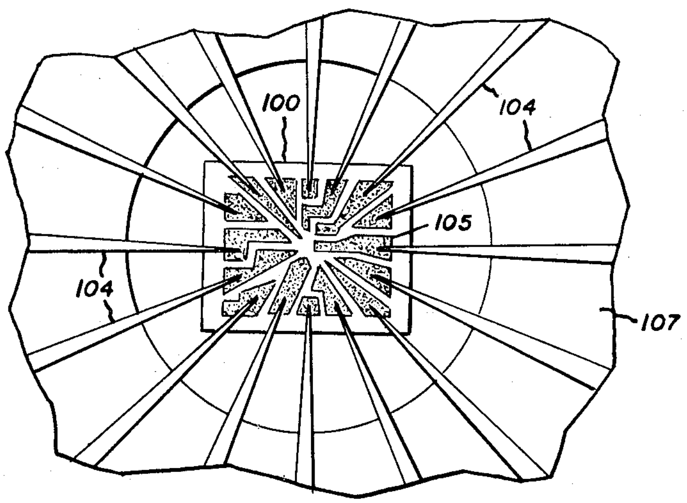
FIG. 7 is an enlarged view of a semiconductor pellet secured to a set of leads supported by a carrier according to the invention.

FIG. 7 depicts an enlarged view of a monolithic integrated circuit type of semiconductor pellet 100 having a plurality of metallic contacts to which the inner terminations of the metallic leads 104 are bonded. The shaded areas 105 on the pellet define the electrical contact regions on the pellet face. With the device depicted in FIG. 7, a suitable thermally conductive member or heat sink may be secured to the bottom face or back of the pellet, and the pellet, inner ends of leads 104 and a portion of heat sink 105A may be enclosed in a suitable encapsulant of plastic, glass, or the like. Alternatively, such encapsulant may be placed only on the top face of the pellet to permit later soldering down of the pellet to an external heat sink. Numeral (107) depicts the insulating tape.

Figure 8:
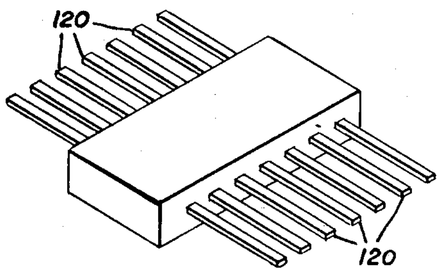
FIGS. 8, 9 and 10 represent various types of semiconductor devices that may be produced according to the invention.
Figure 9:
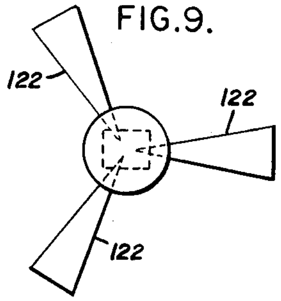
Figure 10:
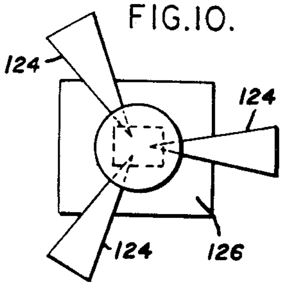

After each semiconductor pellet has been bonded to a lead pattern, various steps may be performed. FIG. 8 depicts a finished integrated circuit in which leads 120 have been placed over the set of leads on the carrier and bonded thereto, and in which the pellet has been encapsulated, and the product then molded, deflashed and sheared from the carrier. FIG. 9 depicts a transistor in which the pellet has been encapsulated and the set of leads 122 severed within the aperture in the carrier. FIG. 10 shows a transistor in which the pellet has been encapsulated and the leads 124 of the set have been severed, but a small film 126 of the plastic tape has been left to support the encapsulant and the inner lead portions. A suitable metallic heat sink may be attached, by soldering or the like, on the back of the semiconductor pellet in the area referenced by the numeral 101 in FIG. (6). The area 101 may be a solderable metal such as silver, gold, etc.

Figure 11:
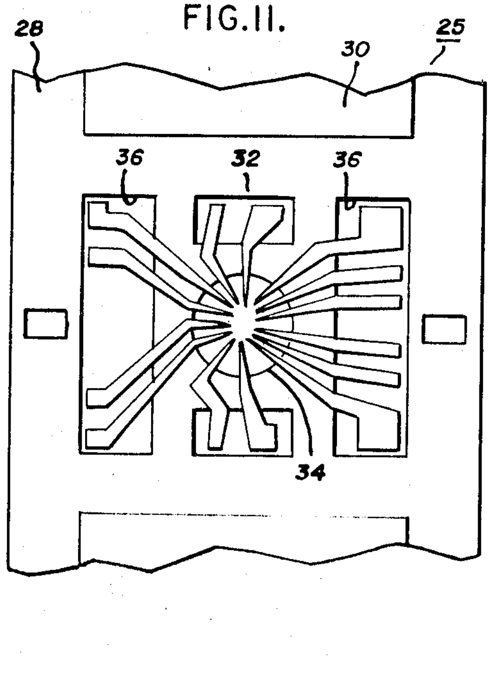
FIG. 11 depicts a modified type of a novel carrier provided by the invention.
Figure 12:
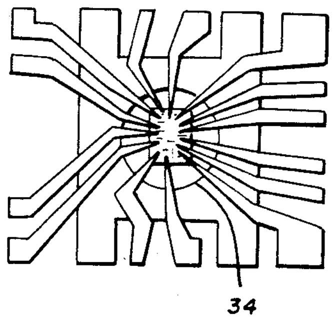
FIG. 12 shows a semiconductor device manufactured according to the invention and utilizing a carrier of the type shown in FIG. 11.

FIG. 11 depicts a modified type of laminated carrier or article 25. As shown in FIG. 11, the article 25 consists of a layer of flexible electrically insulating tape 28, which may have properties such as those of the tape 10, and a metallic strip or layer 30 adhered to said tape 28, which metallic layer has the properties of the metallic layer 16. The metallic layer 30 adheres to a surface of the insulating tape 28 and covers at least a plurality of substantially equally spaced apart foraminous areas 32. Each foraminous area 32 is comprised of a central aperture 34 and a plurality of outer slots 36 arranged generally transverse or normal to radii therethrough from aperture 34. The central aperture 34 in each area 32 is provided for locating the inner end portions of a set of leads formed from the metallic layer 30, and the plurality of outer apertures or slots 36 are provided for locating outer portions of the set of lead, so that a portion of the tape including a central aperture and the set of leads associated therewith may be readily removed from the remainder of the tape by severing said tape along lines connecting said slots 36. The resulting severed structure is shown in FIG. 12.

Figure 13:
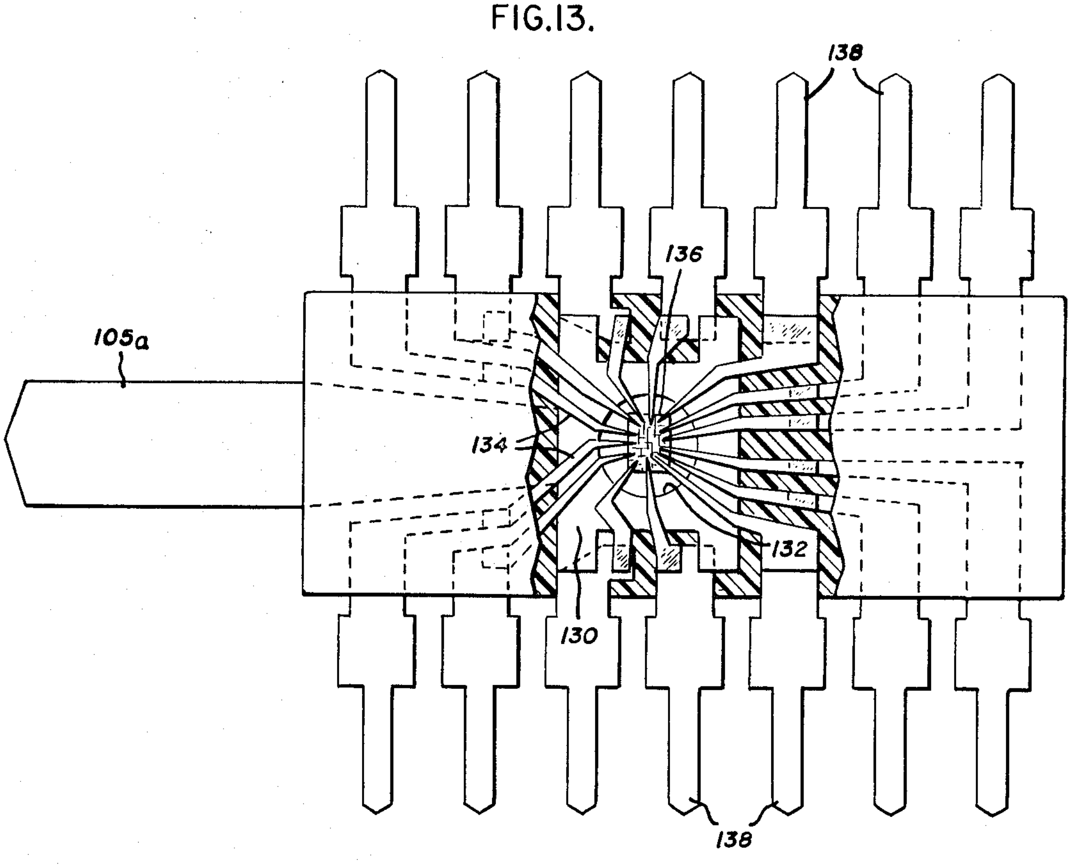
FIGS. 13 and 14 represent additional embodiments of the invention.

FIG. 13 depicts an additional embodiment of the invention. As shown therein, a flexible tape 130 of electrically insulating material having a central aperture 132 supports a set of metallic leads 134 which are carried by the tape and adhere to one surface thereof. The leads 134 are arranged on the surface of the tape in the prior disclosed pattern of fingers extending generally radially outward from the aperture 132, with the inner end portions extending inwardly within the periphery of the aperture and terminating in registry with a set of contact regions of the semiconductor pellet 136. The semiconductor pellet 136 is arranged in registry with the aperture 132, and the inner ends of the metallic fingers are secured or joined with the respective contact regions of the semiconductor pellet. According to another feature of the invention, each of the metallic leads 134 is connected at its outer end to a respective relatively stiff metallic terminal pin 138 in the shaded regions shown in FIG. 13. A plastic encapsulant enclosed the tape 130, pellet 136, and leads 134, and a portion of each of said terminal pins 138, so that the external appearance of the article of manufacture would appear as shown in FIG. 8, with only the encapsulant and terminal pins in view.

Figure 14:
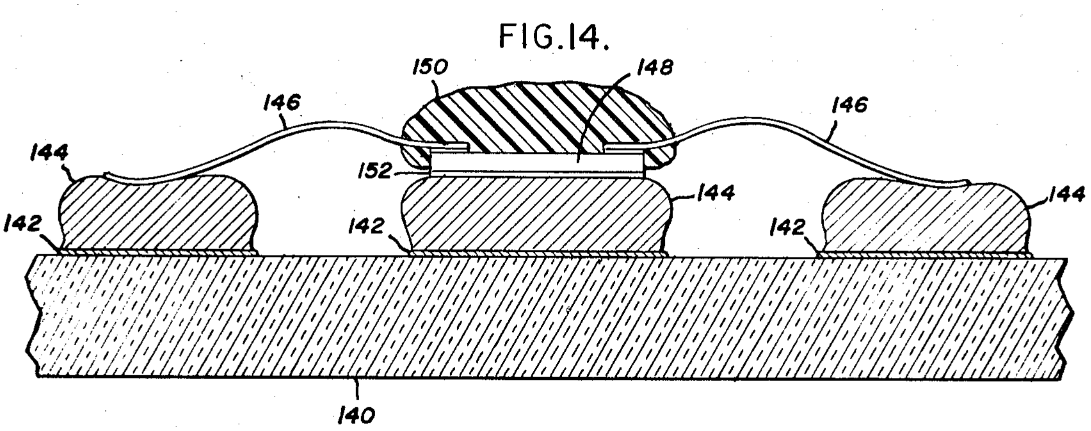

FIG. 14 represents a further embodiment of the instant invention. As shown in FIG. 14, a ceramic or insulative substrate 140 carries a plurality of metallized areas 142 which are joined to one surface of the substrate 140. Each of the metallic areas 142 on the substrate is solder coated so that a quantity of solder 144 is available for connecting leads attached to a semiconductor pellet. According to a salient feature of the invention, after a set of leads 146 is connected to contact regions of a semiconductor pellet 148 (as for example, in FIG. 7 where the leads 104 of the set have been connected to contact regions of the pellet 100), the remaining plastic portion of the insulating tape which supports the set of leads is removed from the set of leads by any suitable method or means such as peeling, stripping, etc. and a plastic encapsulant 150 is applied to enclose the inner end portions of the set of leads and at least the contact regions of the semiconductor pellet 148, while the back portion of the semiconductor pellet 148 remains unexposed. In this manner, the back region 152 of the pellet may be utilized to provide a solderable metallic heat sink element by joining the back region 152 (which may be a solderable metal such as silver, gold, etc.) to its respective solder coated metal area. The metal leads 146 may be bonded or secured to the respective solder areas 144 by conventional means such as impulse soldering, etc. Noting FIG. 14, it is apparent that the leads 146 extending from the semiconductor pellet 148 bow upwardly away from the edge of the semiconductor pellet between the attachment to the pellet and the metallic areas 142. Thus, the length of each bowed lead 146 is greater than the minimum distance between the points of attachment of the lead to the semiconductor pellet and the solder areas 144.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

I claim:

1. A process for fabricating a semiconductor device comprising forming in a flexible insulative carrier an aperture which is substantially larger than a semiconductor pellet intended to be located therein, securing a metallic foil to the carrier so that the foil entirely covers the aperture, removing portions of the foil, including portions that cover the aperture, to form on the insulative carrier a plurality of spaced finger-like leads each extending inwardly beyond the periphery of the aperture in cantilevered relation to the carrier, locating a semiconductor pellet within the aperture having formed thereon metallic contacts, the semiconductor pellet being spaced inwardly from the periphery of the aperture and the metallic contacts being registered with the cantilevered portions of the leads, simultaneously joining the inner terminations of the leads to the registered metallic contacts on the semiconductor pellet, and severing the leads within the aperture to separate the semiconductor device from the carrier.

2. A process according to claim 1 in which the semiconductor pellet and adjacent lead portions are encapsulated within a molded housing prior to severing the leads from the carrier.

3. A process according to claim 1 in which a heat sink is attached to a surface of the semiconductor pellet opposite to that bonded to the leads.

4. A process according to claim 1 in which the inner terminations of the leads are joined to the metallic contacts of the semiconductor pellet by bringing a heatable bonding tool into engagement with the portions of the leads that overlie the semiconductor pellet, the heatable bonding tool remaining spaced from the surrounding carrier, and generating heat within the bonding tool to effect bonding.

5. A process for fabricating a semiconductor device comprising forming an aperture in a flexible insulative carrier for the purpose of receiving a semiconductor pellet therein, forming adjacent to, but spaced from the aperture a plurality of slots in the flexible insulative carrier, securing a metallic foil to the carrier so that the foil entirely covers the aperture and the slots, removing portions of the foil, including portions that cover the aperture and slots, to form on the insulative carrier a plurality of spaced finger-like leads each extending inwardly beyond the periphery of the aperture in cantilevered relation and each extending outwardly to overlie the slots, locating a semiconductor pellet within the aperture having formed thereon metallic contacts so that the metallic contacts are registered with the cantilevered portions of the leads, simultaneously joining the inner terminations of the leads to the registered metallic contacts on the semiconductor pellet, and severing from the carrier the portion thereof lying between the aperture and the slots for the purpose of permitting removal of the semiconductor device from the carrier.

6. A process according to claim 5 in which the semiconductor pellet, the portion severed from the carrier, and the leads are mounted within a housing by the additional steps comprising attaching comparatively stiff terminal pins to those portions of the leads which originally overlay the slots, and molding an encapsulant about the semiconductor pellet, severed carrier portion retained with the semiconductor pellet, and the leads so that only the comparatively stiff terminal pins extend from the plastic encapsulant.

7. A process according to claim 5 in which the semiconductor pellet, the portion severed from the carrier, and the leads are mounted within a housing by the additional steps comprising attaching comparatively stiff terminal pins to those portions of the leads which originally overlay the slots, bonding the semiconductor pellet to a comparatively stiff terminal pin intended to serve as a heat sink for the device, and molding an encapsulant about the semiconductor pellet and leads so that only the comparatively stiff terminal pins extend from the plastic encapsulant.

8. A process according to claim 1 in which the semiconductor device removed from the carrier is mounted on a dielectric substrate by the additional steps comprising bonding a surface of the semiconductor pellet opposite to the surface bonded to the leads to the surface of a dielectric substrate, bonding the outer extremities of the leads to the dielectric substrate at locations spaced from the bonding of the semiconductor pellet thereto and spaced from each other, and forming an insulative protective member on exposed surface portions of the semiconductor pellet.

* * * * *

UNITED STATES PATENT AND TRADEMARK OFFICE

CERTIFICATE OF CORRECTION

PATENT NO. : 3,689,991

DATED : September 12, 1972

INVENTOR(S) : Alanson D. Aird

It is certified that error appears in the above-identified patent and that said Letters Patent are hereby corrected as shown below:

On the first page: Under "Related U.S. Application Data", [63] should read:

[63] Continuation of Ser. No. 709,561, March 1, 1968, abandoned.

Column 1, line 7 "Ser. No. 709,651" should be changed to read -- Ser. No. 709,561 --

Signed and Sealed this

Eighth Day of March 1977

[SEAL]

*Attest:*

RUTH C. MASON
*Attesting Officer*

C. MARSHALL DANN
*Commissioner of Patents and Trademarks*